(12) United States Patent
Duarte et al.

(10) Patent No.: US 6,347,038 B1
(45) Date of Patent: Feb. 12, 2002

(54) ELECTRONIC ASSEMBLIES WITH A HEAT SINK, ESPECIALLY FOR A CONTROL MODULE OF A MOTOR-VEHICLE HEADLIGHT DISCHARGE LAMP

(75) Inventors: Marc Duarte; Jean-Marc Nicolaï; Adrian Prajescu, all of Bobigny Cedex (FR)

(73) Assignee: Valeo Vision, Bobigny (FR)

( * ) Notice: Subject to any disclaimer, the term of this patent is extended or adjusted under 35 U.S.C. 154(b) by 0 days.

(21) Appl. No.: 09/667,886

(22) Filed: Sep. 22, 2000

(30) Foreign Application Priority Data

Sep. 22, 1999 (FR) .............................. 99 11828

(51) Int. Cl.[7] .............................. H05K 7/20
(52) U.S. Cl. ...................... 361/705; 361/719
(58) Field of Search ................ 361/703–705, 361/707–711, 713, 715, 717–719, 720, 784, 807, 809, 810; 257/706, 713, 726, 722, 727; 165/80.3, 185; 174/252, 16.3

(56) References Cited

U.S. PATENT DOCUMENTS

| | | | |
|---|---|---|---|
| 5,367,434 A | * | 11/1994 | Griffin et al. ............... 361/719 |
| 5,798,908 A | * | 8/1998 | Herzberger et al. ......... 361/707 |
| 5,949,191 A | * | 9/1999 | Cassese et al. ............... 315/82 |
| 6,084,776 A | * | 7/2000 | Cuntz et al. ................. 361/707 |
| 6,175,497 B1 | * | 1/2001 | Tseng |
| 6,205,028 B1 | * | 3/2001 | Matsumura |
| 6,222,733 B1 | * | 4/2001 | Gammenthaler |

FOREIGN PATENT DOCUMENTS

| | | |
|---|---|---|
| FR | 2 742 294 A1 | 6/1997 |
| FR | 2 784 001 A1 | 3/2000 |

OTHER PUBLICATIONS

English Abstract of FR 2 742 294.
English Abstract of FR 2 784 001.

* cited by examiner

Primary Examiner—Gerald Tolin
(74) Attorney, Agent, or Firm—Morgan & Finnegan LLP

(57) ABSTRACT

The assembly has a metal sole plate forming a heat sink carrying a printed circuit card. The sole plate includes bearing surfaces which project slightly beyond the rest of the sole plate. The printed circuit is supported on these bearing surfaces and they include fixing means which interact with supplementary means of the printed circuit card to fix the printed circuit card onto the sole plate. A thermally conducting and electrically insulating material is interposed between the said card and the sole plate. The printed circuit card and the sole plate exert compression stress on the thermally conducting and electrically insulating material.

11 Claims, 7 Drawing Sheets

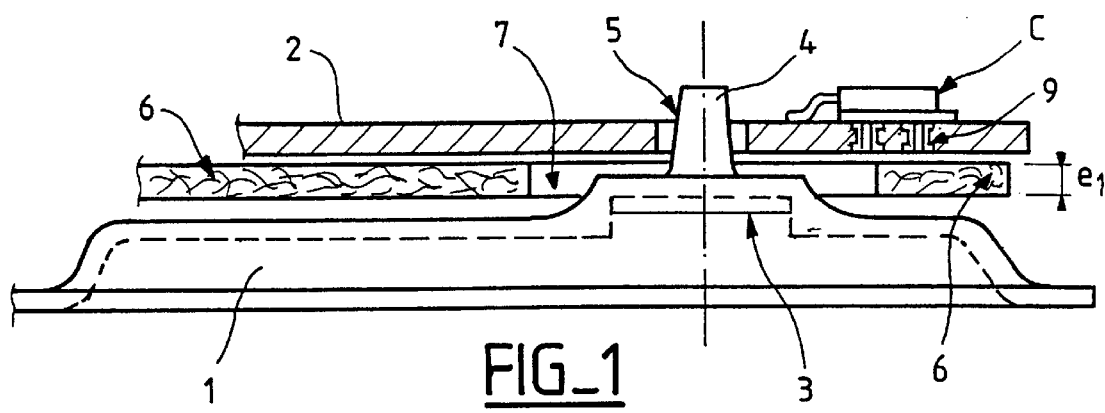
FIG_1
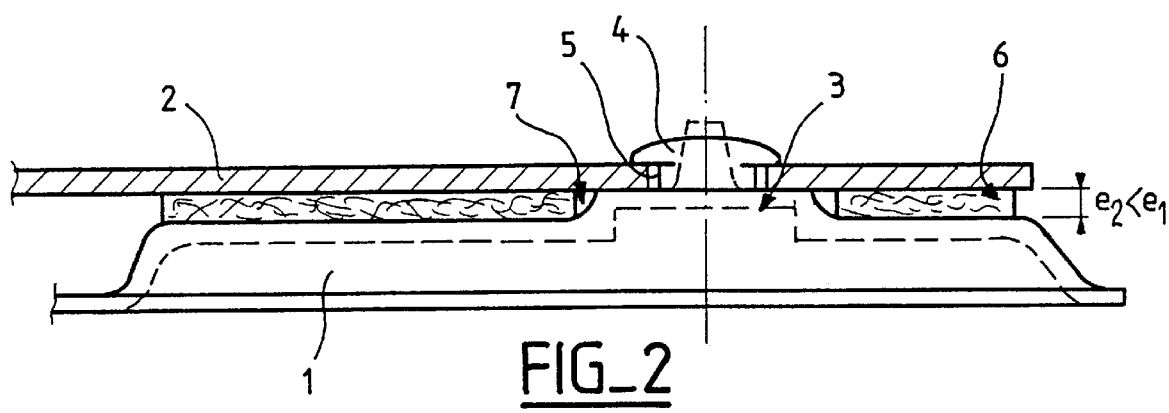
FIG_2
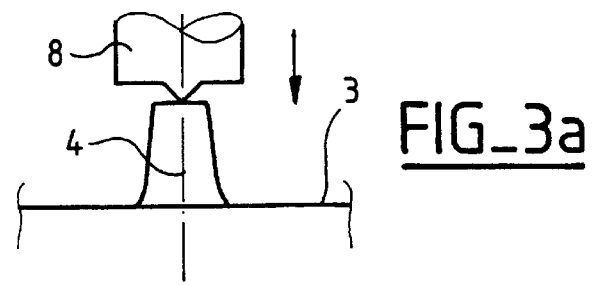
FIG_3a
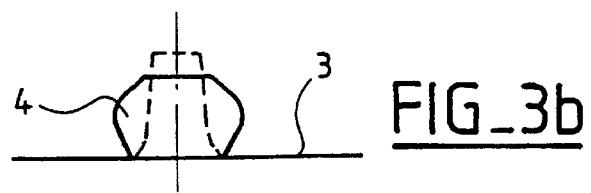
FIG_3b

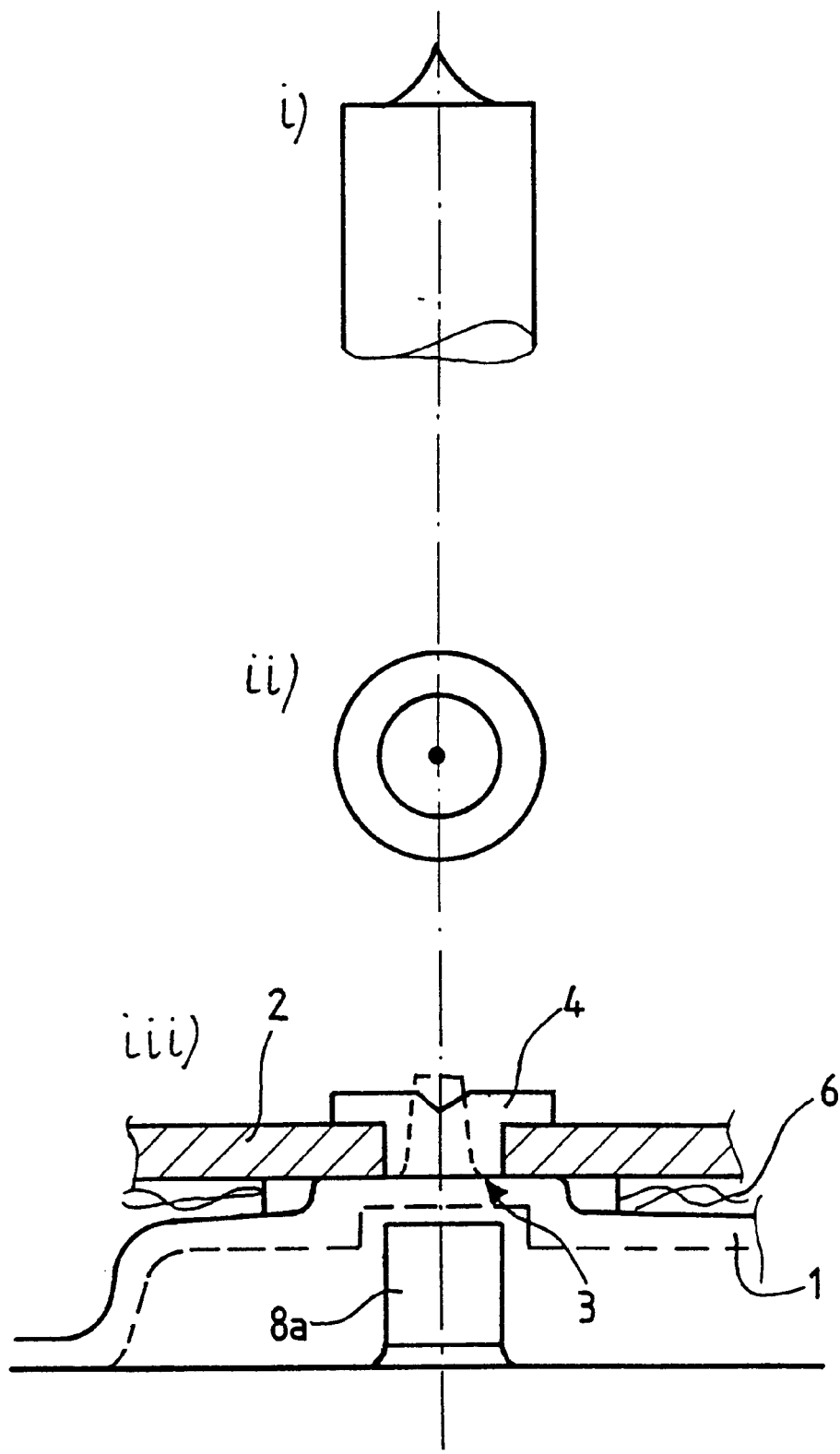
FIG_4a

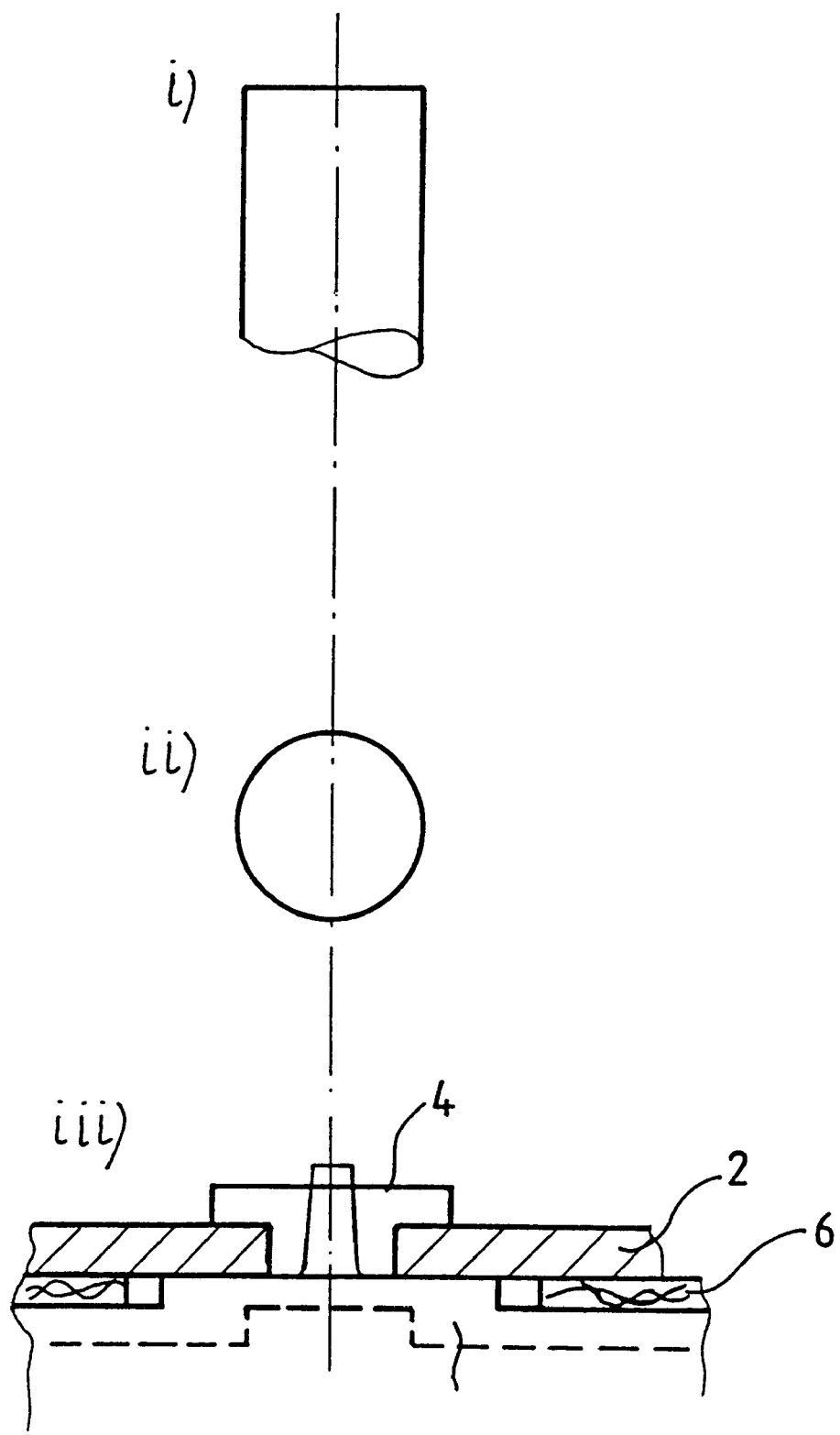
FIG_4b

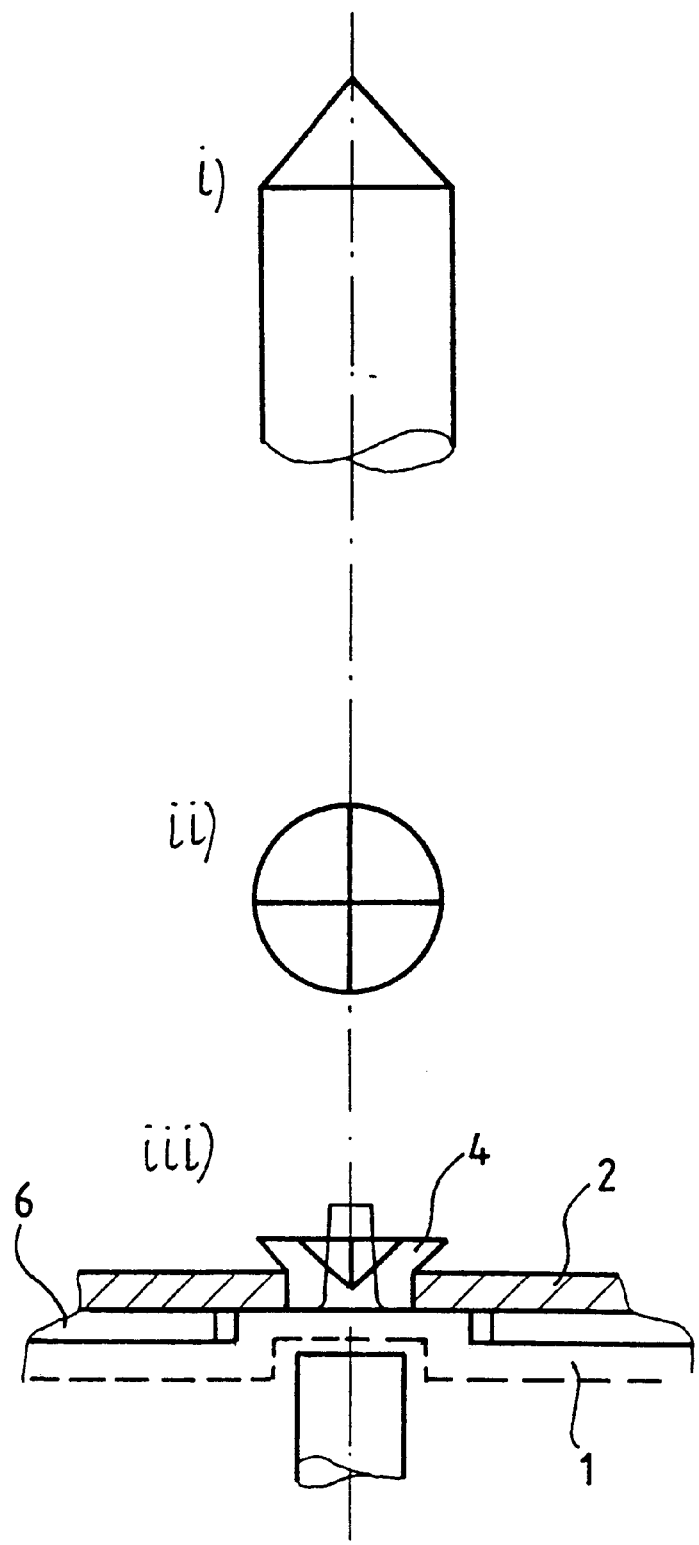
FIG_4c

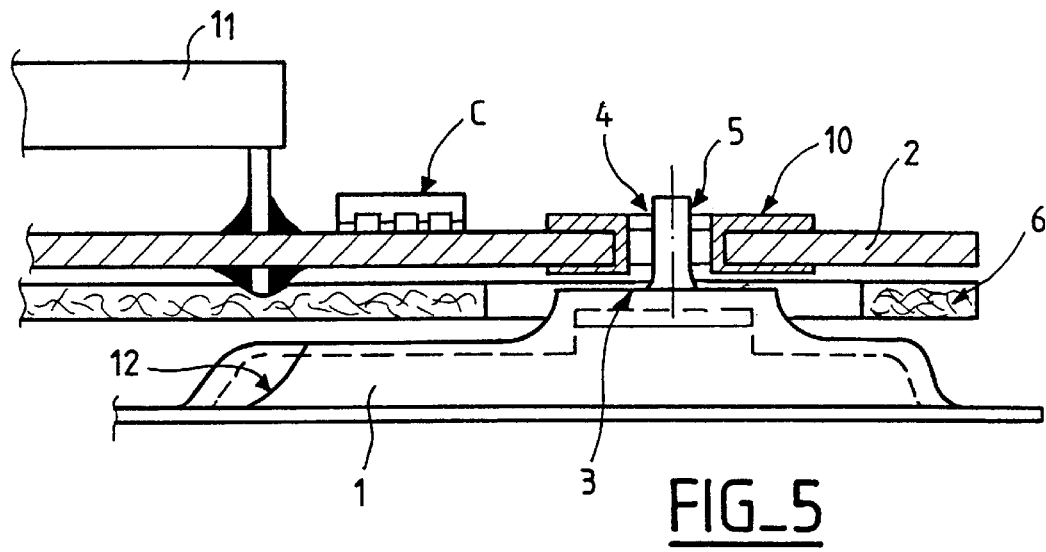
FIG_5
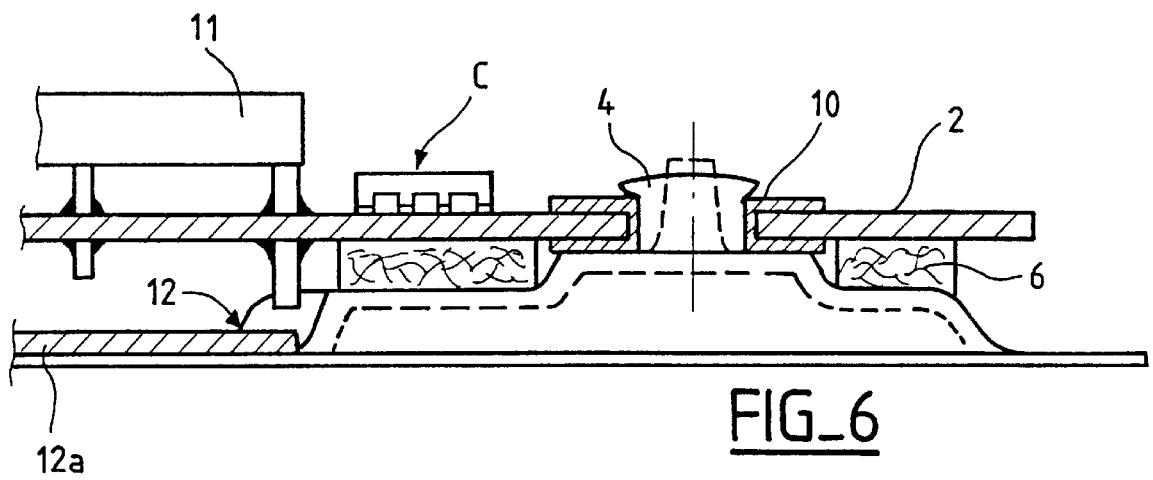
FIG_6
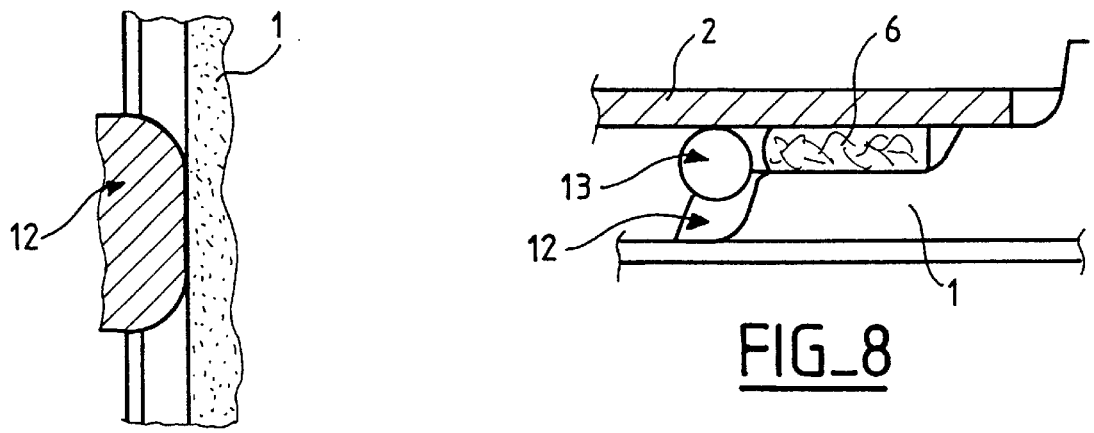
FIG_7
FIG_8

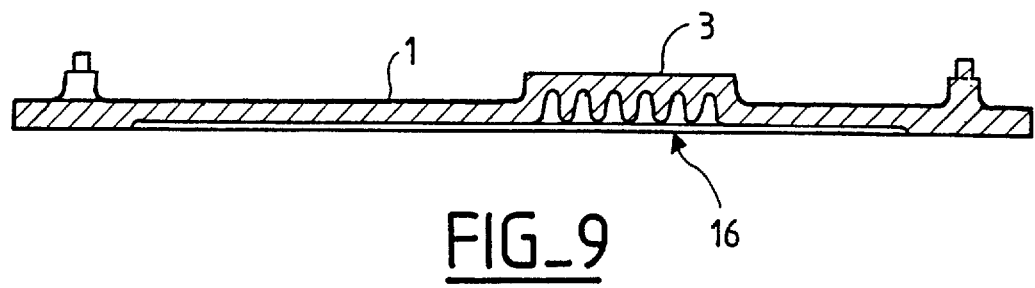
FIG_9
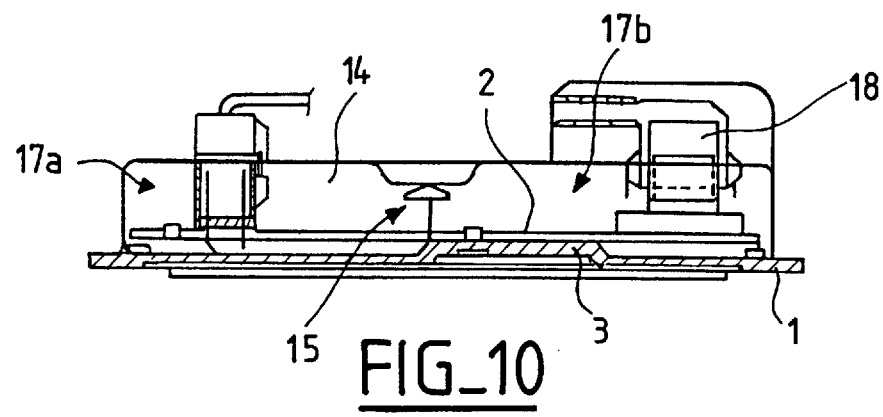
FIG_10
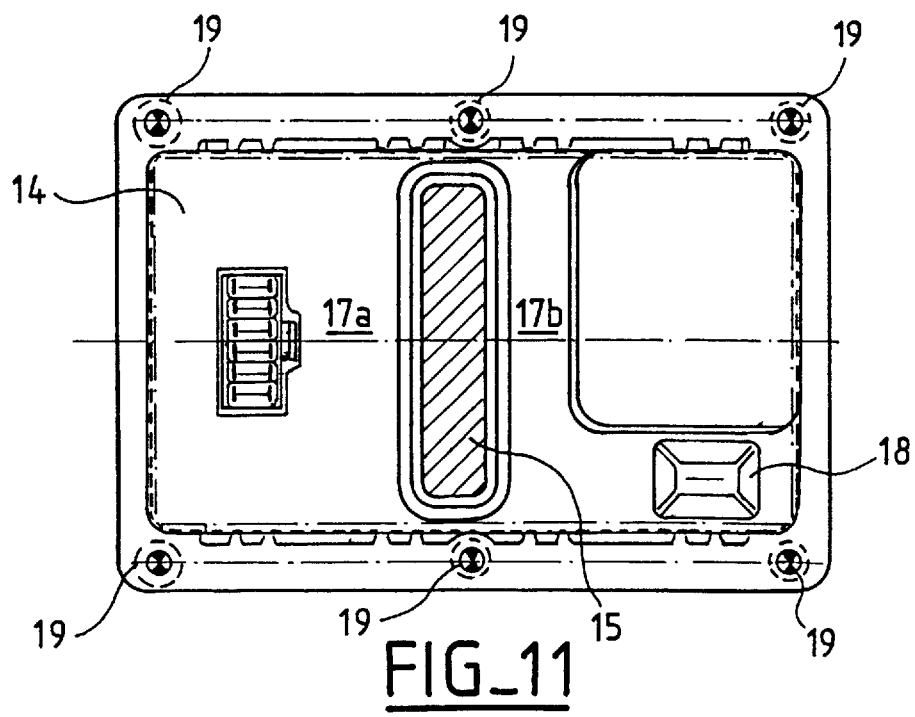
FIG_11

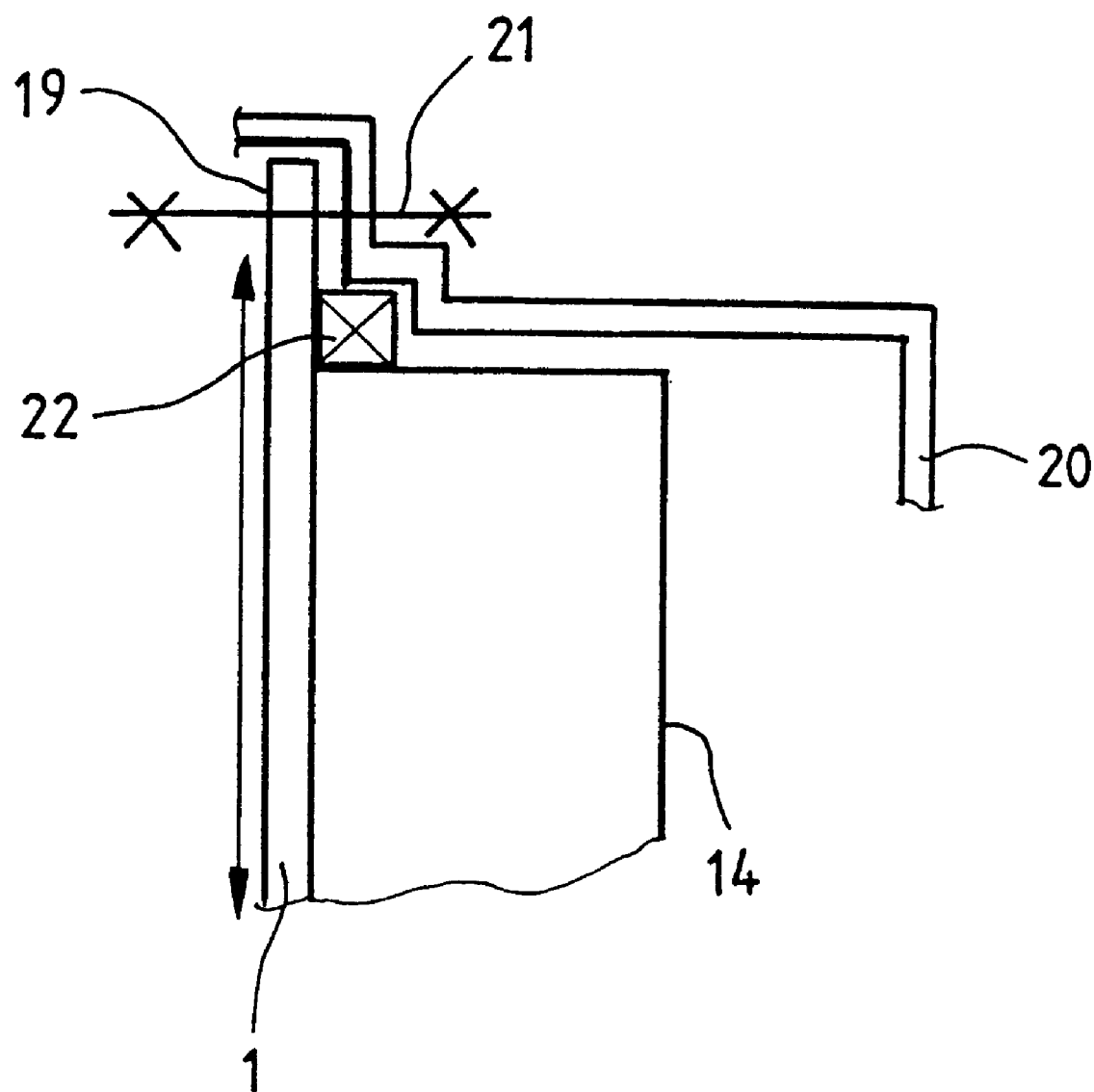
FIG_12

ELECTRONIC ASSEMBLIES WITH A HEAT SINK, ESPECIALLY FOR A CONTROL MODULE OF A MOTOR-VEHICLE HEADLIGHT DISCHARGE LAMP

FIELD OF THE INVENTION

The present invention relates to electronic assemblies with a heat sink.

It finds an advantageous application particularly for control modules of a motor-vehicle headlight discharge lamp.

BACKGROUND OF THE INVENTION

Assembly structures with a heat sink for control modules of a motor-vehicle headlight discharge lamp have already been described, particularly in the patent applications FR 95 14.647 and FR 98 12.219.

The assemblies described in these patent applications include a metal sole plate, which constitutes a heat sink, and a printed circuit card which is assembled, for example by bonding, onto the said sole plate.

The layers used to form the bonding do not necessarily allow good thermal transfer between the printed circuit card and the sole plate.

One object of the invention is to propose an assembly structure which makes it possible to enhance the thermal exchanges between the printed circuit card and the sole plate, while being simple in construction and of low cost.

SUMMARY OF THE INVENTION

According to a first aspect of the present invention there is provided assembly including a metal sole plate forming a heat sink, as well as a printed circuit card carried by the said sole plate, wherein the sole plate includes at least two bearing surfaces which project slightly with respect to the rest of the said sole plate and on which the printed circuit is supported, the said bearing surfaces including fixing means which interact with supplementary means of the printed circuit card to fix the printed circuit card onto the sole plate, and wherein a thermally conducting and electrically insulating material is arranged in the areas between the bearing surfaces, being interposed between the said card and the said sole plate, the printed circuit card and the sole plate exerting a compression stress on the thermally conducting and electrically insulating material.

With such an assembly structure, the material interposed between the printed circuit card and the sole plate is perfectly in contact with the said card and the said sole plate, and provides excellent thermal transfer between the two.

The presence of the bearing surfaces prevents the material being crushed upon fixing and makes it possible to prevent any electrical contact between the card and the sole plate, while preserving the thermally conducting and electrically insulating properties for the intermediate material.

Advantageously, the printed circuit card features at least one thermal via in which the thermally conducting and electrically insulating material is accommodated, on which the printed circuit card and the sole plate exert a compression stress.

The presence of one or more thermal vias into which the intermediate material flows contributes to further enhancing the thermal exchanges.

The assembly according to the invention is, moreover, advantageously supplemented by the various following characteristics taken alone or according to all their technically possible combinations:

- the fixing means which a bearing surface features comprise at least one crimping spike which interacts with a complementary orifice of the printed circuit card;
- a crimping hole of the printed circuit card features metallisation in contact with the crimping spike; this metallisation provides for the earth to be taken up between the sole plate and the printed circuit card; it moreover provides stiffening for the printed circuit card in the crimping area;
- the sole plate includes at least one counter-shape for accommodating at least one part of an element which extends in projection from the printed circuit card towards the sole plate;
- the sole plate, in line with a bearing surface, carries cooling fins which extend in projection with respect to that face of the said sole plate which is opposite the printed circuit card;
- the assembly includes a screening cap affixed to the sole plate in order to cover over the printed circuit card and the intermediate layer;
- it includes a metal separation partition, and the printed circuit card carries, on one side of this metal partition, control electronics which particularly comprise a microprocessor and, on the other side of this partition, power electronics;
- the metal partition is extended through the printed circuit card as far as the metal sole plate so as to define with it and the screening cap two chambers which are isolated from one another especially from electromagnetic disturbances.

According to another aspect of the invention there is provided a control module for a motor-vehicle headlight discharge lamp, and comprising an assembly of the first aspect of the invention.

BRIEF DESCRIPTION OF THE DRAWINGS

Other characteristics and advantages of the invention will emerge further from the description which follows. This description is purely illustrative and not limiting. It should be read in the light of the attached drawings in which:

FIGS. 1 and 2 diagrammatically represent, in section, an assembly in accordance with a first preferred embodiment of the invention, before and after crimping;

FIGS. 3a and 3b illustrate the operation of crimping the card of the assembly of FIGS. 1 and 2 onto the sole plate of the said assembly;

FIGS. 4a to 4c illustrate the various shapes of punch which can be used to shape the spikes;

FIGS. 5 and 6 are representations similar to those of FIGS. 1 and 2, illustrating another preferred embodiment of the invention;

FIG. 7 is a diagrammatic representation, in top view, illustrating a detail of the assembly of FIGS. 5 and 6;

FIG. 8 is a diagrammatic representation in a partial sectional view illustrating yet another preferred embodiment of the invention;

FIG. 9 is a diagrammatic representation in section of a possible embodiment for a sole plate of an assembly in accordance with the invention;

FIGS. 10 and 11 are diagrammatic representations in section illustrating the arrangement of the screening elements on an assembly in accordance with one possible embodiment of the invention;

FIG. 12 is a diagrammatic representation in partial section illustrating the mounting of an assembly in accordance with one embodiment of the invention into a headlight.

DESCRIPTION OF THE PREFERRED EMBODIMENTS

In the various figures, like reference numerals refer to like parts.

The assembly which is represented in FIGS. 1 and 2 includes a metal sole plate 1, which constitutes a heat sink, as well as a printed circuit card 2 which is mounted onto the said sole plate 1 and which carries one or more surface-mount components C (SMC components), as well as a microprocessor if appropriate (not represented in FIGS. 1 and 2).

This metal sole plate 1 is made of aluminum, for example.

It is of generally flat shape and features one or more bearing surfaces 3 which project slightly with respect to the rest of the said sole plate 1 and on which the printed circuit card 2 is supported.

It can be produced by stamping or else by molding under pressure.

These bearing surfaces 3 themselves feature one or more spikes 4 which extend in projection with respect to the said bearing surfaces 3.

The spikes 4 which a bearing surface 3 features are crimping spikes, which pass through the card 2 at complementary orifices 5 which the said card 2 features. They further provide for the earth to be picked up.

A layer 6 of an electrically insulating and thermally conducting material is interposed between the card 2 and the sole plate 1.

This layer 6 extends into the areas between the bearing surfaces 3. The recesses which it features for this purpose in the region of the bearing surfaces 3 have been referenced by 7 in FIGS. 1 and 2.

By way of example, the said layer 6 may be formed from a silicone gel reinforced by a web of glass fibers.

The construction of the assembly which has just been described can be carried out in the following way.

The layer 6 is placed on the sole plate 1, positioning the recesses 7 of this layer 6 on the bearing surfaces 3.

Then the printed circuit electronics card 2 is placed on the sole plate 1 and the layer 6, presenting the orifice or orifices 5 over the spike or spikes 4.

With the card 2 being supported on the bearing surfaces 3, it is crimped by flattening the spike or spikes 4 by means of a tool 8 (FIG. 3a).

The spike or spikes 4 are then deformed, as illustrated in FIG. 3b, so as to fill up the orifice or orifices 5.

The card 2 is then completely fixed onto the sole plate 1.

The said card 2 is prevented from moving perpendicularly to the plane along which it extends by the head of the spike or spikes 4, which is flattened onto the face of the card 2 opposite the sole plate 1.

Moreover, the material of the spike or spikes 4 which fills up the orifice or orifices 5 prevents the card 2 moving in directions parallel to the plane along which it extends. It contributes to preventing the said card 2 moving perpendicularly to the said plane.

Furthermore, the stress which the crimping produces by means of the spike or spikes 4 compresses the layer 6 made of thermally conducting material.

The said layer 6, before construction, is in fact of a thickness slightly greater than the height between the bearing surfaces 3 and the rest of the sole plate 1.

The compression of the layer 6 promotes the transfer of heat energy between the card 2 and the sole plate 1, the bearing surfaces 3, however, ensuring a minimum thickness for the said layer 6 so that the latter retains its thermally conducting and electrically insulating properties, despite the compression.

In FIGS. 1 and 2, the thickness of the layer 6 before crimping has been referenced by e1; its thickness after crimping having been referenced by e2. The height between the bearing surfaces 3 and the rest of the sole plate 1, for its part, has been referenced by e3. As can be understood, e3 corresponds to the minimum value which the thickness e2 can take up.

In order to promote the thermal transfer, the card 2 can be traversed, in line with the components C, by orifices 9 covered by a deposition of copper (copper-plated "vias").

During construction, the material of the layer 6 flows into the said orifices 9. The material which is thus present in the said orifices or vias 9 contributes to a better thermal behavior of the assembly.

It will be noted that the shape which is given to the spikes may vary according to the function or the orientation which it is desired to give them. Hence, certain shapes of spikes are more favorable for taking up the earth and others are more suitable for retention.

FIGS. 4a, 4b and 4c illustrate different shapes which can be envisaged for the punch 8. In particular, it may be of the pointed type (FIG. 4a), of flat type (FIG. 4b), or else pyramid shaped (FIG. 4c), depending on the shape which it is desired to give the head of the spike 4. In FIG. 4a, iii), a support anvil 8a has also been represented, on which the sole plate 1 is seated and which serves to prevent the deformation of the said sole plate 1 when the punch 8 comes to flatten the spike 4.

Furthermore, centering spikes or studs can be provided on the bearing surfaces 3 (not represented in the figures), which are arranged in proximity to the spikes 4 in order to prevent the card 2 moving during the crimping.

Hence, the spikes or spigots which a bearing surface 3 features carry out three functions: crimping, earth pickup, centering, a single spike or spigots possibly carrying out several of these functions.

Moreover, crimping spikes may be provided on the sole plate 1 at places other than in the region of the bearing surfaces 3, especially in proximity to the heavy components and the connectors carried by the card 2, so as to limit the vibration of the card and to reduce the stresses during the fitting/removal of the connectors.

Clearly, the fitting method which has just been described is not in any way a limitation. In particular, various elements may be pre-assembled.

For example, the printed circuit card 2 and the layer 6 may be pre-assembled, with the said card 2 being equipped with components. Equally, the layer 6 may be pre-assembled onto the sole plate 1.

Variants other than those of FIGS. 1 and 2 may obviously be envisaged.

In particular, as illustrated in FIGS. 5 to 7, the crimping orifices 5 may be reinforced by a layer 10 extending into the said orifices and onto the edges thereof. This reinforcement 10 may be insulating or conducting. In the case in which it is conducting, it can be used to provide for the earth to be picked up between the metal sole plate 1 and the face of the printed circuit card 2 which is opposite the said sole plate 1. It then consists of a copper metallisation, for example.

Moreover, the printed circuit card 2 may accommodate components other than surface-mount components, and especially through components 11.

Provision is then advantageously made on the sole plate 1, in line with the through components 11, for counter-shapes 12 making it possible to free space in order to accommodate the lugs of these through components 11.

As illustrated in FIG. 6, provision is advantageously then made for a layer 12a which extends onto the sole plate 1 in line with the lugs of the components 11 and which makes it possible to avoid breakdowns between the said lugs and the said sole plate 1 (the said lugs and the said sole plate are in effect at different potentials).

In yet another variant, it can be envisaged, as illustrated in FIG. 8, that the printed circuit card 2 be a two-sided card accommodating one or more CMS components 13 brazed onto its face directly opposite the sole plate 1.

The sole plate 1 then advantageously features a counter-shape 12 in line with the said component 13.

In yet another variant, as illustrated in FIG. 9, the sole plate 1 may feature cooling fins 16 extending in line with the bearing surfaces 3, projecting with respect to the face of the sole plate 1 which is opposite the printed circuit card 2.

In FIGS. 10 and 11 is illustrated an assembly of the type of those described by reference to FIGS. 1 to 7, supplemented by screening elements.

These screening elements particularly include a screening cap 14 which is affixed onto the sole plate 1 and which covers over the assembly.

They further include a metal partition 15 affixed onto the card 2 in order to isolate two areas thereof.

This partition 15 extends over substantially the entire width of the said card 2.

It features a base part by which it is carried by the card 2, and is in electrical contact with at least one earth track of the said card. It is in contact, moreover, with the cap 14 via its part opposite the said base part. The part of the cap 14 which is in contact with the said partition 15 is a stamped part of the said cap.

A partition of this type has already been described, for example in the patent application FR 98 12.219 to which reference will advantageously be made.

The printed circuit card 2 may be a card with several layers, including an earth plane which is linked to the partition 15 or to an earth track 15 which the said card features.

The two parts 17a, 17b delimited by the metal partition 15 on the card 2 carry, on one hand, power components of the control module, and, on the other hand, control components and particularly a management microprocessor.

The part which carries the power components is linked, by means of a screened cable 18 fastened to the cap 14, to the discharge lamp or to other power components which power the lamp.

The metal partition 15 is extended through the printed circuit card 2 as far as the metal sole plate 1, in order to define with it and the screening cap 14 two chambers which are isolated from one another from the electromagnetic disturbances which they generate. Hence, two separate screening boxes 17a, 17b are available.

The signals passing from one of these parts 17a, 17b to the other can be filtered in the region of the partition 15 by filtering means provided for this purpose (capacitor, RC filter, etc.).

An earth pickup is provided between the cap 14 and the said screened cable 18, for example by a metal spring part interposed between the two or else by an elastic lug which the cap 14 features. This earth pickup provides the electrical continuity between the control module and the discharge lamp.

In the example illustrated in FIGS. 10 and 11, the cap 14 is fixed onto the sole plate 1 by crimping. Reference could advantageously be made in this regard to the patent application FR 98-02.478.

It will be noted that one of the advantages of the technique which has just been described lies in that it does not require fixing holes on the sole plate 1, so that the assembly defined by the said sole plate 1 and the cap is leaktight.

This characteristic makes the assembly particularly suited to its use for a motor-vehicle headlight control module.

To that end, the sole plate 1 may include, on its edges, a plurality of holes, referenced by 19 in FIGS. 11 and 12, allowing it to be fixed into a headlight assembly.

In FIG. 12 has been illustrated a layout including an assembly in accordance with those which have just been described, fixed by screws 21 onto a headlight housing 20. A gasket 22 carried by the sole plate 1 and surrounding the cap 14 is interposed between the said housing 20 and the assembly.

The assembly area which is leaktight is that which is illustrated by a double arrow in FIG. 12.

What we claim is:

1. An assembly including a metal sole plate forming a heat sink, as well as a printed circuit card carried by the said sole plate, wherein the sole plate includes at least two bearing surfaces which project slightly with respect to the rest of the said sole plate and on which the printed circuit is supported in direct contact with each of said at least two bearing surfaces, the said bearing surfaces including fixing means which interact with supplementary means of the printed circuit card to fix the printed circuit card onto the sole plate, and wherein a thermally conducting and electrically insulating material is arranged in the areas between the bearing surfaces, being interposed between the said card and the said sole plate, the printed circuit card and the sole plate exerting a compression stress on the thermally conducting and electrically insulating material.

2. The assembly of claim 1, wherein the printed circuit card features at least one thermal via in which the thermally conducting and electrically insulating material is accommodated, on which the printed circuit card and the sole plate exert a compression stress.

3. The assembly of claim 1, wherein the fixing means of a bearing surface comprise at least one crimping spike which interacts with a complementary orifice of the printed circuit card.

4. The assembly of claim 3, wherein a crimping hole of the printed circuit card is reinforced by a layer which extends particularly in its interior.

5. The assembly of claim 4, wherein the said layer is a metallisation layer which, by contact with the crimping spike, provides for the earth to be taken up between the sole plate and the printed circuit card.

6. The assembly of claim 1, wherein the sole plate includes at least one counter-shape for accommodating at least one part of an element which extends in projection from the printed circuit card towards the sole plate.

7. The assembly of claim 1, wherein the sole plate, in line with a bearing surface, carries cooling fins which extend in projection with respect to that face of the said sole plate which is opposite the printed circuit card.

8. The assembly of claim 1, comprising a screening cap affixed to the sole plate in order to cover over the printed circuit card and the intermediate layer.

9. The assembly of claim 1, comprising a metal separation partition, and wherein the printed circuit card carries, on one side of this metal partition, control electronics which particularly comprise a microprocessor and, on the other side of this partition, power electronics.

10. The assembly of claim 9, wherein the metal partition is extended through the printed circuit card as far as the metal sole plate so as to define with it and the screening cap two chambers which are isolated from one another especially from electromagnetic disturbances.

11. A control module for a motor-vehicle headlight discharge lamp comprising:

a metal sole plate forming a heat sink, as well as a printed circuit card carried by the said sole plate, wherein the sole plate includes at least two bearing surfaces which project slightly with respect to the rest of the said sole plate and on which the printed circuit is supported in direct contact with each of said at least two bearing surfaces, the said bearing surfaces including fixing means which interact with supplementary means of the printed circuit card to fix the printed circuit card onto the sole plate, and wherein a thermally conducting and electrically insulating material is arranged in the areas between the bearing surfaces, being interposed between the said card and the said sole plate, the printed circuit card and the sole plate exerting a compression stress on the thermally conducting and electrically insulating material.

* * * * *